Oct. 22, 1968 W. B. BIENERT ETAL 3,407,037

PROCESS OF MAKING $MN_4$ $SI_7$ THERMOELECTRIC ELEMENT AND PRODUCT OF SAID PROCESS

Filed Feb. 10, 1965 3 Sheets-Sheet 1

INVENTORS
Walter B. Bienert
Floyd M. Gillen

BY Littlepage + Quaintance

ATTORNEYS

INVENTORS
Walter B. Bienert
Floyd H. Gillen

BY Littlepage & Quaintance
ATTORNEYS

INVENTORS
Walter B. Bienert
Floyd M. Gillen

BY Littlepage & Quaintance

ATTORNEYS

United States Patent Office 3,407,037
Patented Oct. 22, 1968

1 2

3,407,037

PROCESS OF MAKING $Mn_4Si_7$ THERMOELECTRIC ELEMENT AND PRODUCT OF SAID PROCESS

Walter B. Bienert, Baltimore, and Floyd M. Gillen, Bradshaw, Md., assignors to Martin-Marietta Corporation, New York, N.Y., a corporation of Maryland Filed Feb. 10, 1965, Ser. No. 431,668
2 Claims. (Cl. 23—204)

ABSTRACT OF THE DISCLOSURE

A process of making improved, crack-free $Mn_4Si_7$ thermoelements and the products by process made by mixing Mn and Si in a molar ratio of 4:7, melting the mixture, solidifying the melt, crushing the solid melt into finely divided particles, and hot pressing the finely divided particles into the shape desired.

This invention relates to an improved thermoelectric material and is particularly directed to a high temperature P-type thermoelectric compound $Mn_4Si_7$ and improved thermoelectric devices made with this compound.

It is well known that when two rods of dissimilar thermoelectric compositions have their ends joined to form a continuous loop, two thermoelectric junctions are established between the respective ends so joined. If the two junctions are maintained at different temperatures, an electromotive force will be set up in the circuit thus formed. This effect is called the thermoelectric or Seebeck effect, and may be regarded as due to the charge carrier concentration gradient produced by a temperature gradient in the two materials. The effect cannot be ascribed to either material alone, since two dissimilar, thermoelectrically complementary materials are necessary to obtain this effect. It is therefore customary to measure the Seebeck effect produced by a particular material by forming a thermocouple in which one circuit member of thermoelement consists of this material, and the other circuit member consists of a metal such as copper or lead, which produces a negligible amount of thermoelectric power. The thermoelectric power (Q) of a material is the open circuit voltage developed by the above thermocouple when the two junctions are maintained at a temperature difference of 1° C.

When thermal energy is converted to electrical energy by means of thermocouple devices utilizing the Seebeck effect, each device may be regarded as a heat engine operating between a heat source at a relatively hot temperature $T_H$ and a heat sink at a relatively cold temperature $T_C$. The limiting or maximum efficiency theoretically attainable from any heat engine is the Carnot efficiency, which is $$\frac{T_H - T_C}{T_H}$$

Thus it is well known that the efficiency of Seebeck devices is increased by increasing the temperature difference T between the hot junction temperature $T_H$ and the cold junction temperature $T_C$. It is usually convenient to operate such Seebeck devices with the cold junction at room temperature, but for any given $T_C$ temperature, it follows that highest efficiency in the conversion of thermal energy to electrical energy requires that the hot junction temperature $T_H$ be as high as possible.

Some thermoelectric compositions such as bismuth telluride which are useful at relatively low temperatures cannot be operated at elevated temperatures because they tend to break down or react with the environment when heated to high temperatures. It is therefore necessary for highly efficient Seebeck devices to utilize only those thermoelectric compositions which are stable at elevated temperatures.

Relatively thermally stable thermoelectric materials currently being used are generally not capable of operating for an extended period when exposed to relatively high heat sources such as nuclear reactors. Lead telluride for example reaches peak efficiency at about 600° K., falls off to about ¾ of this value at 800° K. and above 800° K. seriously decomposes due to the volatilization of tellurium. Most prior art thermoelectric materials are ineffective when subjected to heat sources between 800 and 1100° K. Some other disadvantages of prior art thermoelectric materials include decomposition, a low figure of merit at high temperatures or a high figure of merit over too narrow a temperature range, loss of mechanical strength, oxidation, excessive capture of neutrons in thermal reactors, and/or high cost.

Thus an object of this invention is to provide an improved thermoelectric compound having improved thermoelectric properties for application to power generation over a wider and higher temperature range.

Another object of this invention is to provide an improved thermoelectric compound which has a relatively high figure of merit over the wide range of temperatures between 300 and 1100° K.

Another object of this invention is to provide a thermoelectric element that can be used with heat sources as high as 1100° K. for an extended period of time without any serious depreciation of electrical or mechanical properties.

Another object of this invention is to provide a thermoelectric material that has a higher and more reproducible figure of merit than MnSi or $MnSi_2$.

Another object of this invention is to provide a thermoelement that has a low neutron capture cross section for use in nuclear reactors.

Another object of this invention is to provide a relatively more economical thermoelectric material.

Other objects and advantages of this invention will become apparent from the accompanying drawings and description and the essential features will be set forth in the appended claims.

Figure 1:
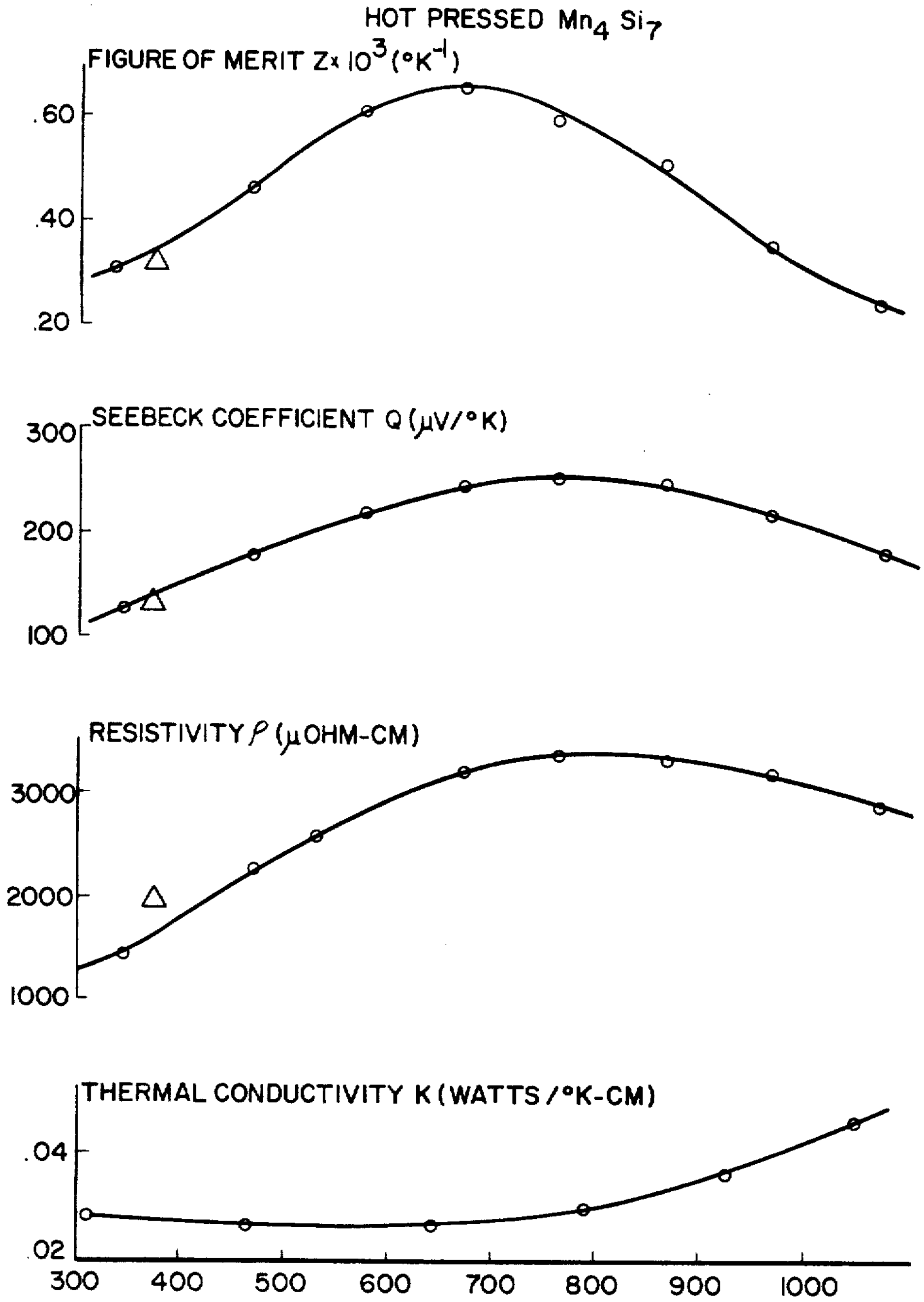
FIGURE 1 is a series of graphs showing the variation of various $Mn_4Si_7$ thermoelectrical properties with temperature.

Good thermoelectric materials being near-degenerate semiconductors, may be classed as N-type or P-type, depending on whether the majority carriers in the material are electrons or holes, respectively. The conductivity type of thermoelectric materials may be controlled by adding appropriate acceptor or donor impurity substances. Whether a particular material is N-type or P-type may be determined by noting the direction of current flow across a junction formed by a circuit member of thermoelement of the particular thermoelectric material and another thermoelement of complementary material when operated as a thermoelectric generator according to the Seebeck effect. The direction of the positive (conventional) current in the cold junction will be from the P-type toward the N-type thermoelectric material. The compositions of this invention have P-type conductivity.

There are three fundamental requirements for desirable thermoelectric materials. The first requirement is the development of a high electromotive force per degree difference in temperature between junctions in a circuit containing two thermoelectric junctions. This quality is referred to as the Seabeck coefficient of thermoelectric power (Q) of the material, and may be defined as $$dV/dT$$

where $dV$ is the potential difference induced by a temperature difference $dT$ between two ends of an element made of the material. The second requirement is a low thermal conductivity (K), since it would be difficult to maintain either high or low temperatures at a thermoelectric junction if one or both of the thermoelectric materials conducted heat too readily. High thermal conductivity in a thermoelectric material would reduce the efficiency of the resulting Seebeck or Peltier device. The third requisite for a good thermoelectric material is high electrical conductivity ($\sigma$), or, conversely state, low electrical resistivity ($\rho$). High electrical resistivity would make it difficult to generate the large currents that are necessary to obtain a high conversion efficiency.

A quantitative approximation of the quality of a thermoelectric material may be made by relating the above three factors Q, K and P in a figure of merit Z, which is usually defined as $$Z=\frac{Q^2}{\rho K}$$

in those instances in which the thermocouple is made up of two materials of which one is N-type and the other P-type but in which all other properties are the same. Here Q is the thermoelectric power, $\rho$ is the electrical sensitivity and K is the total thermal conductivity. Alternatively, the figure of merit Z may be defined as $$\frac{\sigma Q^2}{K}$$

where $\sigma$ is the electrical conductivity or reciprocal of $\rho$, and Q and K have the same meaning as above.

The validity of $$\frac{Q^2}{\rho K}$$

as a figure of merit for the indication of usefulness of thermoelectric materials for practical applications is well established. Thus as objectives high thermoelectric power, high electrical conductivity and low thermal conductivity are desired. These objectives are difficult to attain because materials which are good conductors of electricity are usually good conductors of heat, and the thermoelectric power and electrical resistivity of a material are not independent of each other. Accordingly, the objective becomes the provision of a material with maximum ratio of electrical to thermal conductivities and a high thermoelectric power.

We have discovered that a new compound $Mn_4Si_7$ has excellent thermoelectric properties and maintains a relatively high figure of merit over an unusually wide temperature range. The thermoelectric properties of $Mn_4Si_7$ are superior to those of known manganese silicides such as MnSi and $MnSi_2$.

The composition of this invention $Mn_4Si_7$ can be used with heat sources as high as 1100° K., it maintains an adequate figure of merit over an unusually wide temperature range, it maintains good mechanical strength for long periods of time, it resists oxidation, it has a low neutron capture cross section which make is suitable for use inside thermal nuclear reactors, and it is relatively inexpensive when compared with other known high temperature thermoelectric materials.

In order to determine the properties of $Mn_4Si_7$ an extensive series of samples of formed bodies of $Mn_4Si_7$ were prepared using different known techniques such as various casting, hot pressing, zone refining and powder metallurgy. All of the samples had a manganese to silicon ratio of 1 to 1.75. These samples were subject to micrometallographic and X-ray examination and their thermoelectric properties were evaluated. These tests, and the criteria set out below, have shown that MnSi 1.75 basically is a crystalline single phase compound $Mn_4Si_7$. The stoichiocasting, hot pressing, zone refining and powder metallurgy. was determined by the following criteria:

(1) The parameters $x$ and $y$ in the formula $Mn_xSi_y$ must be small integers with a ratio of $y:x$ of approximately 1.75:1.

(2) The tetragonal unit cell with $a=5.52$ A. and $c=17.46$ A. must contain a small integer number of molecules of $Mn_xSi_y$.

(3) The theoretical density of that compound must be close to 5.1 g./cm.$^3$: the measured density of the one composition with almost no second phase.

The only integers $x$ and $y$ which are in agreement with all three requirements are 4 and 7. From the evidence presented we concluded that the only "compound" that meet the above criteria is $Mn_4Si_7$. Typical thermoelectric properties of $Mn_4Si_7$, obtained as described below, are shown in FIGURE 1.

Several of these samples yielded excellent results with a maximum figure of merit as high as $1.07\times10^{-3}$ ° K.$^{-1}$ at 700° K. However, a definite lack of reproducibility of this high figure of merit in the results became apparent when additional specimens were tested and revealed extensive cracking throughout. The cracks appeared to reduce the measured values of electrical resistivity and consequently appeared to increase power factor.

In order to obtain useable crack free samples of $Mn_4Si_7$ having reproducible thermoelectric properties several methods of forming the samples were explored. First, effects of the cooling rate on cast material were determined. Variations in the speed with which the sample was removed from the hot zone of the furnace provided a control over the number and size of the cracks, but did not eliminate them. Fast cooling (up to 4.5" per minute) caused a few large cracks, while slow cooling (down to 0.04" per minute) resulted in many small cracks in the sample.

Degassing was tried because many of the samples had been prepared in a hydrogen atmosphere, and manganese metal is known to absorb hydrogen readily. Proceeding on the assumption that a dissolved gas could be a major source of cracking, some samples were prepared in a vacuum. The resulting specimens, nevertheless, were still badly cracked. As part of this same approach, a quantity of Mn metal was outgassed by heating it to the melting point in a dynamic vacuum. The metal was then crushed and reacted with silicon in a vacuum; but cracking was observed again.

Another method for forming the sample selected was that of attempting to grow single crystals of $Mn_4Si_7$ using standard crystal growing techniques. Due to a lack of time, we did not succeed in obtaining single crystals of large enough size to be of use in evaluating the thermoelectric properties, but we did show that the cracks originated mostly at the impurities. The leading end of the grown ingot had fewer impurties and also had fewer cracks than the tail end, where the impurities accumulated.

The one method for forming the sample which resulted in the production of crack-free samples was hot pressing. The hot pressed thermoelements were found to have more uniform and reproducible properties and were more mechanically rugged. Basically, it was found cracks could be avoided if the $Mn_4Si_7$ were first formed as a melt, crushed into fine particles, and reconstituted in the form of a desired article by pressing and compacting at elevated temperatures and pressures sufficiently high to constitute a unitary article.

For instance, test samples (typical dimensions: cylinders with ½ inch cross section and 1" long) were made by mechanically blending elements Mn and Si in the molar ratio of 4:7, then melting the mixture by induction heating or some similar melting treatment to pre-react the Mn and the Si. The pre-reacted $Mn_4Si_7$ was crushed to approximately −200 mesh and hot pressed in a graphite die at approximately 1100° C. with a pressure of approximately 4000 p.s.i. in a hydrogen atmosphere. The hot pressing temperatures used were varied from 1075° C. to 1140° C. and the pressure varied from 3500 to 4500 p.s.i. without noticeable change in properties. The density of most of these samples closely approached the theoretical value, and the measured electrical properties were more reproducible than was the case with cast samples.

A hot pressed sample, prepared in this manner, which had a $0.56 \times 10^{-3}$ ° K.$^{-1}$ figure of merit, was tested for over 1000 hours using a heat source of 1070° K. and a heat sink of 380° K. The figure of merit (Z) decreased approximately 10% during the first 100 hours due to an increase in electrical resistivity. Very little change occurred in any of the properties of the sample over the next 900 hours.

The figure of merit for $Mn_4Si_7$ was generally found to reach its maximum value at approximately 675° K. in both the cast and the hot pressed samples. Although the maximum value attained with hot pressed samples was usually lower than that of cast samples, the maximum was broader over a wider temperature range. Thus, the average figures of merit of the hot pressed samples are not much below those of the cast samples as the difference in maximum values might first suggest. The average figure of merit is about ⅔ to ¾ the maximum value over the entire range of 350° K. to 1000° K. in all cases.

As can be readily seen in FIGURE 1, between room temperature and 1100° K., the properties of $Mn_4Si_7$ vary approximately as follows:

| | 300° K. | 700–800° K. | 1,100° K. |
|---|---|---|---|
| Seebeck coefficient (μv./° K.) | 120 | 235 | 170 |
| Electrical resistivity (μohm-cm.) | 1,500 | 3,500 | 2.300 |
| Thermal conductivity (watts/° K.-cm.) | 0.025 | 0.025 | 0.055 |
| Figure of merit (° K.$^{-1}$) | $0.3 \times 10^{-3}$ | $0.6 \times 10^{-3}$ | $0.2 \times 10^{-3}$ |

The effects of doping were briefly studied by replacing 5 atomic percent of the Mn with Re in one sample, and 5 atomic percent of Si with Ge in another. Obviously other doping materials can be used. As in the case of the pure samples, hot pressing eliminated the problem of cracking and also lowered the figure of merit somewhat. In both instances, the average figure of merit is approximately the same as that found for pure $Mn_4Si_7$. Doping with Re or Ge raised the temperature at which the maximum figure of merit occurs.

Individual samples in which 5.0 atomic percent of the Mn was replaced by Re or Ge exhibited maximum figures of merit of $0.87 \times 100^{-3}$ ° K.$^{-1}$ and $0.56 \times 10^{-3}$ ° K.$^{-1}$.

The known compounds most nearly analogous to $Mn_4Si_7$ are two other silicides, MnSi and $MnSi_2$. We prepared and tested both compounds and found that they have thermoelectric properties which are inferior to those of $Mn_4Si_7$, especially at temperatures above 800° K.

Figure 2:
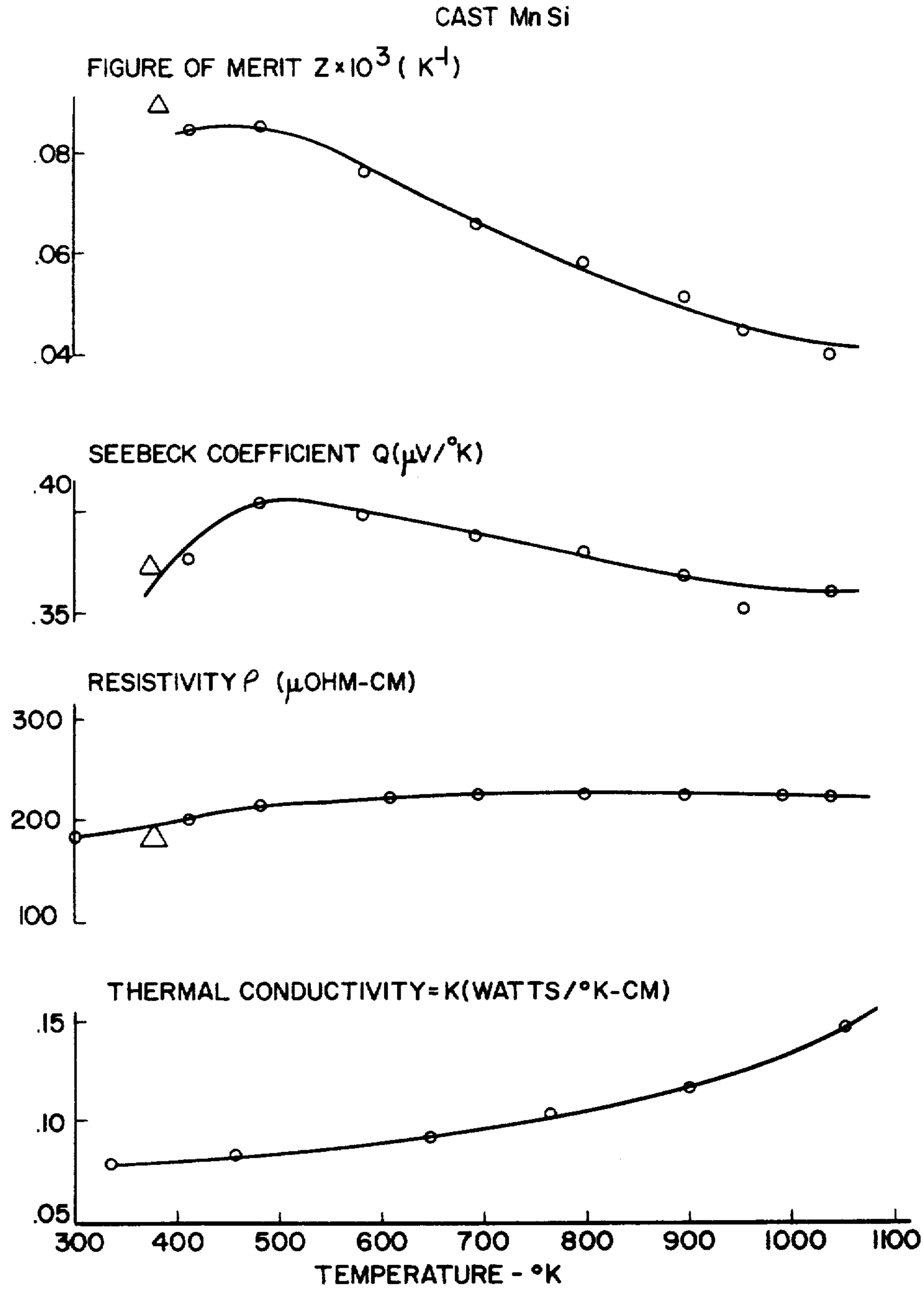
FIGURE 2 is a series of graphs showing the variation of various MnSi thermoelectrical properties with temperature.

MnSi is a crystal with a cubic FeSi type structure and a lattice constant of 4.560 A. Graphs of the thermoelectric properties, Seebeck coefficient, electrical resistivity, thermal conductivity and figure of merit are shown in FIGURE 2. A maximum figure of merit is $0.086^{-3}$ ° K.$^{-1}$ and occurs at 450° F.

Figure 3:
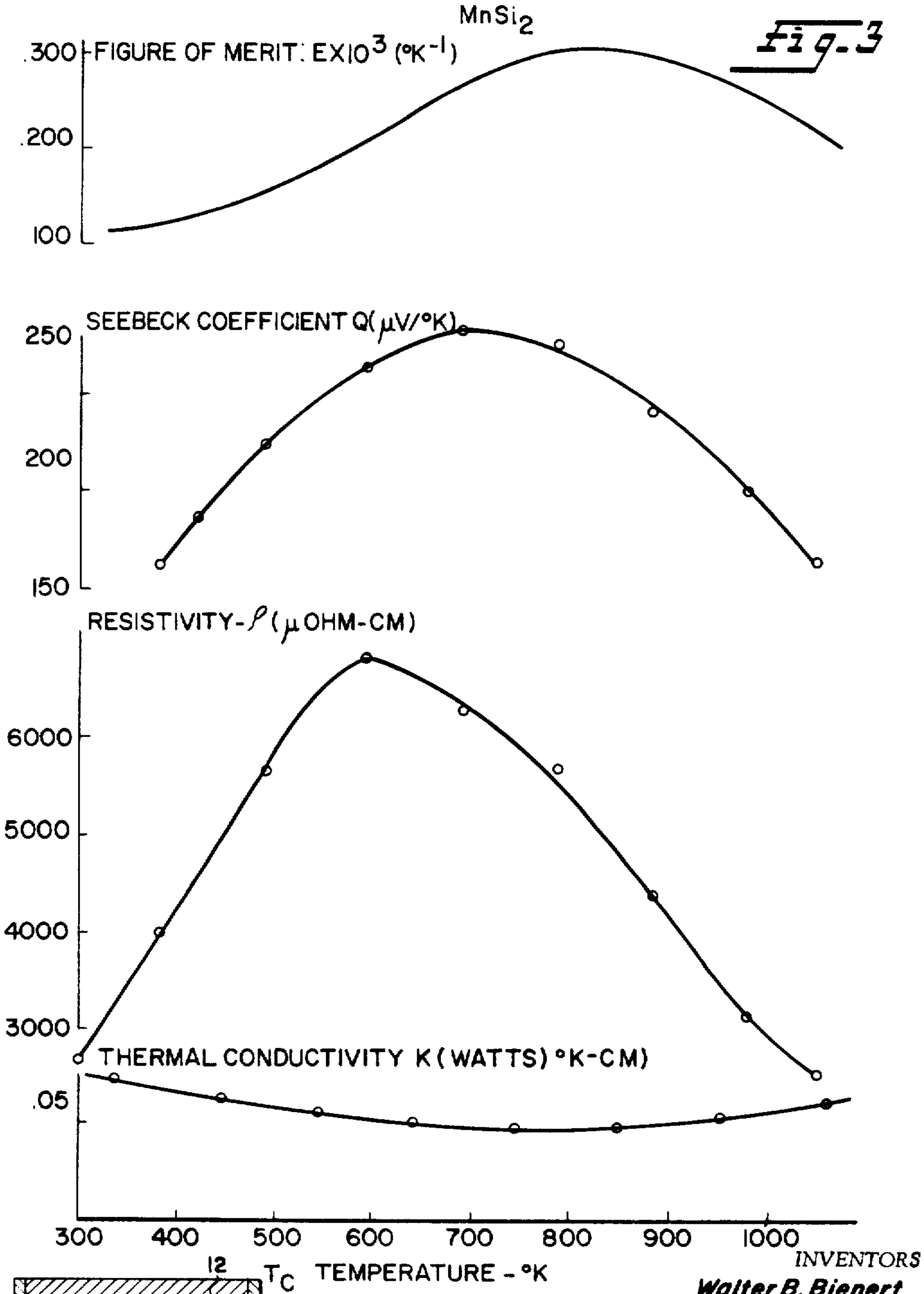
FIGURE 3 is a series of graphs showing the variation of various $MnSi_2$ thermoelectrical properties with temperature.

The compound $MnSi_2$ is reported in the literature as being of the tetragonal structure with 48 atoms per unit cell and $a=5.524$ A. and $c=17.46$ A. Typical thermoelectric properties of specimens with an atomic ratio of Mn to Si according to the formula $MnSi_2$ are shown in FIGURE 3. The maximum figure of merit Z is $0.29 \times 10^{-3}$ ° K.$^{-1}$. and occurs at 800° F.

It should be readily apparent that various impurities can be present in the $Mn_4Si_7$ composition. Such impurities may include small amounts of silicon, MnSi, $MnSi_2$, etc. To obtain the most desirable thermoelectric properties these impurities should be kept to a minimum and the $Mn_4Si_7$ content maintained above 97% by weight and preferably above 99% by weight.

Figure 4:
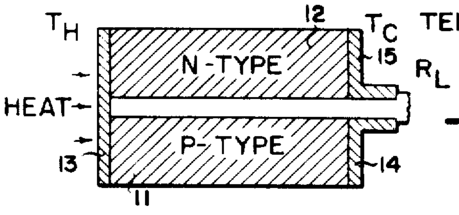
FIGURE 4 is a schematic cross sectional view of a thermoelectric device for the direct transformation of heat energy into electrical energy by means of the Seebeck effect.

An illustration of how the P-type $Mn_4Si_7$ thermoelectric element of this invention can be employed in a typical well-known thermoelectric device is shown in FIGURE 4. The device 10 has a $Mn_4Si_7$ P-type thermoelement 11 and a high temperature N-type thermoelement 12, which are conductively joined at the end that is to be exposed to the high temperature source by a conductor 13 that can be composed of any conducting material used in this art such as copper or some other metal or alloy. The thermoelement 12 may be any known temperature N-type element such as a mixture of lead telluride and tin telluride, which is operable up to 1000° K. The thermoelements 11 and 12 terminate at the opposite end in electrical contacts 14 and 15 respectively. Contacts 14 and 15 in turn are connected to a circuit 16.

In the operation of the device 10, the metal plate 13 is heated to a temperature $T_H$ and becomes the hot junction of the device. The metal contacts 14 and 15 on thermoelements 11 and 12 respectively are maintained at a temperature $T_C$ which is lower than the temperature of the hot junction of the device. The lower or cold junction temperature $T_C$ may, for example, be room temperature. A temperature gradient is thus established in each circuit member 11 and 12 from high adjacent plate 13 to low adjacent contacts 14 and 15, respectively. The electromotive force developed under these conditions produces in the external circuit a flow of (conventional) current (I) in the direction shown by arrows in FIGURE 4, that is, from the P-type thermoelement 11 toward the N-type thermoelement 12 in the external circuit. The device is utilized by connecting a load, shown as a resistance 16 in the drawing, between the contacts 14 and 15 of thermoelements 11 and 12 respectively.

The foregoing discussion should make it apparent that many variations may be made in the illustrative details of this invention without departing from the spirit of the invention or the scope thereof as defined in the appended claims.

What is claimed is:

1. The method of preparing a crack-free $Mn_4Si_7$ thermoelectric element comprising mixing Mn and Si in the molar ratio of 4 to 7 respectively, melting the mixture to form $Mn_4Si_7$, solidifying said melt, crushing said solidified melt to obtain divided material of approximately −200 mesh, and hot pressing said divided material at approximately 1100° C. with a pressure of approximately 4000 p.s.i.

2. The thermoelectric element formed by the method of claim 1.

References Cited

FOREIGN PATENTS 22,612 10/1963 Japan.

(Other references on following page)

OTHER REFERENCES

Korshunov et al.: In, Thermoelectric Properties of Semiconductors, Kutasov (Ed.) 1964. Pp. III, IV and 54–58. (English translation of Termoelectr. Svoistva Poluprov. Akad. nauk SSSR, Inst. Poluprov., Sb. Tr. 1-go (Pervogo i 2-go (Vtorogo) Sveschch. po Termoelectr. 1963, 79–85.)

Lipatova et al.: Trudy Ural Politekh. Inst. im S. M. Kirova Sbornik. v. 72, 1957, cover page and pp. 105 and 108–120. Received in Library of Congress May 1958.

Nikitin: Soviet Physics-Tech. Physics. v. 3, 1958, pp. 20–25.

Transitron Electronic Corp. (1). AD 240,677. ASTIA, November 1960, pp. 1–13.

Transitron Electronic Corp (2). AD 276,005. ASTIA. Released to Public. Sept. 5, 1962. (U.S. Gov. Res. Repts., v. 37, n. 17, pp. 56 and 57 appended). Pp. i, 12, 13, 14, 14b, 14c, 15, 15b, 15e, 15f, 16, 16c, 20 and 24f.

ALLEN B. CURTIS, *Primary Examiner.*